United States Patent

Kano

(10) Patent No.: US 6,552,412 B2
(45) Date of Patent: *Apr. 22, 2003

(54) SEMICONDUCTOR DEVICE WITH QUANTUM-WAVE INTERFERENCE LAYERS

(75) Inventor: Hiroyuki Kano, Aichi (JP)

(73) Assignee: Canare Electric Co., Ltd., Aichi-gun (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/320,510

(22) Filed: May 26, 1999

(65) Prior Publication Data

US 2001/0042859 A1 Nov. 22, 2001

(30) Foreign Application Priority Data

May 26, 1998 (JP) ............................................ 10-162868

(51) Int. Cl.[7] .............................................. H01L 29/15
(52) U.S. Cl. ............................ 257/595; 257/15; 257/17
(58) Field of Search .......................... 257/9, 12, 13–15, 257/17, 19, 20, 21, 24, 79, 94, 96, 97, 183, 184, 186, 187, 192, 199–201, 431, 438, 461, 613–616, 595

(56) References Cited

U.S. PATENT DOCUMENTS

| 5,471,068 | A | * | 11/1995 | Tsuji et al. | ................... | 257/21 |
| 5,528,614 | A | * | 6/1996 | Watanabe | .................... | 372/45 |
| 5,737,350 | A | * | 4/1998 | Motoda et al. | ............... | 372/45 |

FOREIGN PATENT DOCUMENTS

| EP | 0 497 279 | 8/1992 |
| EP | 0 702 439 | 3/1996 |
| EP | 0 935 294 | 8/1999 |
| EP | 0 954 034 | 11/1999 |
| WO | WO 90/05996 | 5/1990 |

OTHER PUBLICATIONS

Takeshi Takagi, et al., "Potential Barrier Height Analysis or AIGaInP Multi-Quantum Barrier (MQB)", Japanese Journal of Applied Physics, vol. 29, No. 11, Nov. 1990, pp. L 1977-L 1980.

(List continued on next page.)

Primary Examiner—George Eckert
Assistant Examiner—Bradley W. Baumeister
(74) Attorney, Agent, or Firm—Oblon, Spivak, McClelland, Maier & Neustadt, P.C.

(57) ABSTRACT

A semiconductor device of a pin junction structure, constituted by a quantum-wave interference layers $Q_1$ to $Q_4$ with plural periods of a pair of a first layer W and a second layer B and middle layers (carrier accumulation layers) $C_1$ to $C_3$. The second layer B has wider band gap than the first layer W. Each thicknesses of the first layer W and the second layer B is determined by multiplying by an odd number one fourth of wavelength of quantum-wave of carriers conducted in the i-layer in each of the first layer W and the second layer B existing at the level near the lowest energy level of the second layer B. A δ layer, for sharply varying energy band, is formed at an every interface between the first layer W and the second layer B and has a thickness substantially thinner than the first layer W and the second layer B. Then quantum-wave interference layers and carrier accumulation layers are formed in series. As a result, a hysterisis characteristic that the device has different values of voltage when the electric current rises and decreases abruptly with a step function, or when the current-voltage characteristic varies with a step function can be found.

11 Claims, 11 Drawing Sheets

OTHER PUBLICATIONS

Akihiko Kikuchi, et al., "Design of AlGaInP Multi–Quantum–Barrier", research materials of The Institute of Electronics, Information and Communication Engineers, Electronic Device 1991–3, pp. 15–21. (with English Abstract).

Takeshi Takagi, et al., "Design of Multi–Quantum Barrier (MQB) and Experimental Verification of MQB Effect", research materials of The Institute of Electronics, Information and Communication Engineers, Optical Quantum Electronics 1991–13, pp. 73–78. (with English Abstract).

Patent Abstracts of Japan, vol. 1999, No. 2, Feb. 26, 1999, JP 10 303438, Nov. 13, 1998.

T. Takagi, et al., Jpn. J. Appl. Phys., vol. 31, Part 1, No. 2A, pps. 197–200, "Electron Wave Reflection By Multiquantum Barrier", Feb., 1992.

S.T. Yen, et al., Appl. Phys. Lett, vol. 64, No. 9, "pps. 1108–1110, Enhancement of Electron–Wave Reflection By Superlattices With Multiple Stacks of Multiquantum Barriers", Feb. 28, 1994.

L.S. Yu, et al., Appl. Phys. Lett, vol. 59, No. 21, pps. 2712–2714, "Largely Enhanced Bound–To–Miniband Absorption in an InGaAs Multiple Quantum Well With Short–Period Superlattice InAlAs/InGaAs Barrier", Nov. 18, 1991.

* cited by examiner

SEMICONDUCTOR DEVICE WITH QUANTUM-WAVE INTERFERENCE LAYERS

BACKGROUND OF THE INVENTION

1. Field of the Invention

The present invention relates to a semiconductor device with a new structure.

2. Description of the Related Art

A diode has been known to have a pn or pin junction structure. With respect to a current-voltage characteristic of the diode, a characteristic that electric current increase when an applied voltage increases and a characteristic that electric current decrease when an applied voltage decreases show identical characteristics. Especially, the diode does not show a hysterisis characteristic in a current-voltage characteristic.

SUMMARY OF THE INVENTION

The inventors of the present invention formed a device having a quantum-wave interference layer which reflects quantum-waves and a middle layer which does not have a multi-period structure but has a plane structure in a band structure, where the quantum-wave interference layer and the middle layer are connected in series, and measured a current-voltage characteristic of the device. The current-voltage characteristic of the device shows that when an applied voltage increases in a forward direction, an electric current rises abruptly at a certain value of voltage with a step function. Also, the current-voltage characteristic of the device shows that when an applied voltage decreases in a backward direction from the region where the electric current increases first, the electric current decreases at a certain value of voltage, which is different from the value described above, with a step function. In short, a hysterisis characteristic that the device has different value of voltage when the electric current rises and decreases abruptly with a step function, or when the current-voltage characteristic varies with a step function can be found.

It is, therefore, an object of the present invention to provide a semiconductor device with a new structure using this hysterisis characteristic. The semiconductor device in the present invention utilizes a hysterisis of the current-voltage characteristic which varies with a step function, and can be applied to Schmitt circuit and a binary element. That is, the device which does not show chattering with respect to a condition variation can be provided.

In the light of these objects a first aspect of the present invention is a semiconductor device which is constituted by a quantum-wave interference layer units having plural periods of a pair of a first layer and a second layer, the second layer having a wider band gap than the first layer, and a middle layer disposed between adjacent two of the quantum-wave interference layer units. Each thickness of the first and the second layers is determined by multiplying by an odd number one fourth of a quantum-wave wavelength of carriers in each of the first and the second layers. Plural units of the quantum-wave interference layers are formed with a middle layer, which does not have a multi-period structure but has a plane band structure, lying between each of the quantum-wave interference units.

The second aspect of the present invention is to set a kinetic energy of the carriers, which determines the quantum-wave wavelength, at the level near the bottom of a conduction band when the carriers are electrons or at the level near the bottom of a valence band in the second layer when the carriers are holes.

The third aspect of the present invention is to define each thickness of the first and the second layers as follows:

$$D_W = n_W \lambda_W/4 = n_W h/4[2m_W(E+V)]^{1/2} \quad (1)$$

and $$D_B = n_B \lambda_B/4 = n_B h/4(2m_B E)^{1/2} \quad (2)$$

In Eqs. 1 and 2, h, $m_W$, $m_B$, E, V, and $n_W$, $n_B$ represent Plank's constant, the effective mass of carrier conducting in the first layer, the effective mass of carriers in the second layer, the kinetic energy of the carriers at the level near the lowest energy level of the second layer, the potential energy of the second layer relative to the first layer, and odd numbers, respectively.

The fourth aspect of the present invention is a quantum-wave interference layer having a partial quantum-wave interference layers $I_k$ with arbitrary periods $T_k$ including a first layer having a thickness of $n_{Wk}\lambda_{Wk}/4$ and a second layer having a thickness of $n_{Bk}\lambda_{Bk}/4$ for each of a plural different values $E_k$, $E_k+V$. $E_k$, $E_k+V$, $\lambda_{Bk}$, $\lambda_{Wk}$, and $n_{Bk}$, $n_{Wk}$ represent a kinetic energy of carriers conducted in the second layer, a kinetic energy of carriers conducted in the first layer, a quantum-wave wavelength corresponding energies of the second layer and the first layer, and odd numbers, respectively.

The fifth aspect of the present invention is to form a middle layer having narrower bandwidth than that of the second layer.

The sixth aspect of the present invention is to form a middle layer having half a thickness of its quantum-wave wavelength $\lambda_B$.

The seventh aspect of the present invention is to form a δ layer between the first layer and the second layer, which sharply varies energy band at the boundary between the first and second layers and is substantially thinner than that of the first and the second layers.

The eighth aspect of the present invention is a semiconductor device having a pin junction structure, and the quantum-wave interference layer and the middle layer are formed in the i-layer.

The ninth aspect of the present invention is to form the quantum-wave interference layer and the middle layer in the n-layer or the p-layer.

The tenth aspect of the present invention is a semiconductor device having a hysterisis characteristic as a current-voltage characteristic.

First to Third, and Eighth to Tenth Aspects of the Invention

The principle of the semiconductor device of the present invention is explained hereinafter. FIG. 1A shows an energy diagram of a conduction band and a valence band when an external voltage is applied to the interval between the p-layer and the n-layer in a forward direction. As shown in FIG. 1A, the conduction band of the i-layer becomes plane by applying the external voltage. Four quantum-wave interference layer units $Q_1$ to $Q_4$ are formed in the i-layer, and middle layers $C_1$ to $C_3$ are formed at each intervals of the quantum-wave interference layer units. FIG. 2 shows a conduction band of a quantum-wave interference layer unit $Q_1$ having a multi-layer structure with plural periods of a first layer W and a second layer B as a unit. A band gap of the second layer B is wider than that of the first layer W.

Electrons conduct from left to right as shown by an arrow in FIG. 2. Among the electrons, those that exist at the level near the lowest energy level of a conduction band in the second layer B are most likely to contribute to conduction. The electrons near the bottom of conduction band of the second layer B has a kinetic energy E. Accordingly, the electrons in the first layer W have a kinetic energy E+V which is accelerated by a potential energy V due to the band gap between the first layer W and the second layer B. In other words, electrons that move from the first layer W to the second layer B are decelerated by potential energy V and return to the original kinetic energy E in the second layer B. As explained above, kinetic energy of electrons in the conduction band is modulated by potential energy due to the multi-layer structure.

When thicknesses of the first layer W and the second layer B are equal to order of quantum-wave wavelength, electrons tend to have characteristics of a wave. The wave length of the electron quantum-wave is calculated by Eqs. 1 and 2 using kinetic energy of the electron. Further, defining the respective wave number vector of first layer W and second layer B as $K_W$ and $K_B$, reflectivity R of the wave is calculated by:

$$R=(|K_W|-|K_B|)/(|K_W|+|K_B|)$$

$$=([m_W(E+V)]^{1/2}-[m_B E]^{1/2})/([m_W(E+V)]^{1/2}+[m_B E]^{1/2})$$

$$=[1-(m_B E/m_W(E+V))^{1/2}]/[1+(m_B E/m_W(E+V))^{1/2}] \quad (3).$$

Further, when $m_B=m_W$, the reflectivity R is calculated by:

$$R=[1-(E/(E+V))^{1/2}]/[1+(E/(E+V))^{1/2}] \quad (4).$$

When $E/(E+V)=x$, Eq. 6 is transformed into:

$$R=(1-x^{1/2})/(1+x^{1/2}) \quad (5).$$

The characteristic of the reflectivity R with respect to the energy ratio x obtained by Eq. 5 is shown in FIG. 3.

And when the second layer B and the first layer W have a s-layers structure, the reflectivity $R_s$ of an incident plane of the quantum-wave is calculated by:

$$R_s=[(1-x^s)/(1+x^s)]^2 \quad (6).$$

When the condition $x \leq 1/10$ is satisfied, $R \geq 0.52$. Accordingly, the relation between E and V is satisfied with:

$$E \leq V/9 \quad (7).$$

Since the kinetic energy E of the conducting electrons in the second layer B exists near the bottom of the conduction band, the relation of Eq. 7 is satisfied and the reflectivity R at the interface between the second layer B and the first layer W becomes 52% or more. Consequently, the multi-layer structure having two kinds of layers with band gaps different from each other enables to reflect quantum-wave of electrons, which conduct in an i-layer, between the first and second layers.

Further, utilizing the energy ratio x enables the thickness ratio $D_B/D_W$ of the second layer B to the first layer W to be obtained by:

$$D_B/D_W=[m_W/(m_B x)]^{1/2} \quad (8).$$

As shown in FIG. 2B, when the forward voltage is applied to the device having quantum-wave interference layer in the i-layer, the energy level of the quantum-wave interference layer band inclined by the external voltage. Then E+V and E, or kinetic energy of the electrons in the first layer W and the second layer B respectively, increase according to a proceeding of quantum-wave. Accordingly, the thicknesses of the first layer W and the second layer B no longer improve the quantum-wave reflectivity of the electrons injected into the i-layer. Consequently, in the range of applied voltage for which the kinetic energy of electrons does not exceed the energy level used to design the thickness of the quantum-wave interference layer, the electrons are reflected and do not cause electric current. But when the applied voltage increases to the degree that the kinetic energy of the electrons injected into the i-layer exceeds the energy level used to design the thicknesses of the quantum-wave interference layer, reflected electrons begin to flow rapidly. Consequently, I-V characteristic of the diode varies rapidly. In short, the dynamic resistance of the diode drops.

As described later, this diode has a current-voltage characteristic that the values of voltage are different when the electric current rises and decreases abruptly, as shown in FIG. 8. In short, it was found that the current-voltage characteristic of the diode shows a hysterisis characteristic.

Although the reason why the current-voltage characteristic of the diode show a hysterisis characteristic is not clear in the present stage, it is considered as following. FIGS. 4A to 4D show energy diagrams of a conduction band of an nip structure: FIG. 4A shows an energy diagram when an external voltage is 0 V; FIG. 4B shows when a voltage is applied at a point that electric current begins to rise abruptly; FIG. 4C shows when a voltage increases abruptly and a large electric current flows; and FIG. 4D shows when a voltage decreases gradually from the condition shown in FIG. 4C and when a voltage is applied at a point that electric current begins to decrease abruptly.

In a range of the applied voltage shown in FIGS. 4A and 4B, a condition when each thicknesses of the quantum-wave interference layers is determined by multiplying by an odd number one fourth of a quantum-wave wavelength of injected electrons is satisfied. In this condition, electrons are reflected by the quantum-wave interference layers and there is no transfer of electrons. When an external voltage is applied until an electric potential gradient becomes as shown in FIG. 4B, a reflection condition is not satisfied and electrons are conducted in the quantum-wave interference layers. Point A shown in FIG. 8 represents the condition. Because electrons are confined by each middle layers $C_1$, $C_2$, and $C_3$, the middle layers $C_1$, $C_2$, and $C_3$ can be defined as carrier accumulation layers. Accordingly, the bottom of a conduction band of the middle layers $C_1$, $C_2$, and $C_3$ is preferably set at a level lower than the bottom of a conduction band of the second layer B. Alternatively, the bottom of the second layer B and the conduction band can be equal. But when the electrons existing in the middle layers $C_1$, $C_2$, and $C_3$ increases, electrons tend to exist in higher level. Then a kinetic energy of the electrons existing in higher level increases, and electrons are not reflected by the quantum-wave interference layer units because of unsatisfaction of the reflection condition. As a result, electrons transmit the quantum-wave interference layer units Q2, Q3, and Q4 and flow toward the p-layer. An energy diagram of the conduction band when the electrons are conducted toward the p-layer is shown in FIG. 4C. Point B in FIG. 8 represents the condition.

Then a current-voltage characteristic when electric current decreases gradually is explained hereinafter. An energy diagram on conduction condition that electric current rises like a step is shown in FIG. 4C. Almost all the external voltage is applied to the certain part of the i-layer which is closer to the n-layer than the first quantum-wave interference layer unit $Q_1$ and the certain part of the i-layer which is set closer to the p-layer than the last quantum-wave interference layer unit $Q_4$, and an electric potential gradient is hardly found between the quantum-wave interference layer units $Q_1$ to $Q_4$. When the applied voltage decreases, electric current continues to flow until the electric potential gradient in the i-layer becomes equal to that shown in FIG. 4B, at the point when electric current begins to rise abruptly. This condition is shown in FIG. 4D. But because no electric potential gradient is found between the quantum-wave interference layer units $Q_1$ to $Q_4$, the external voltage shown in FIG. 4D is smaller than that shown in FIG. 4B. Point C in FIG. 8 indicates the voltage point described above. When the electric potential gradient is as shown in FIG. 4D, a quantum-wave wavelength of injected electrons satisfies a reflection condition, and the electric current decreases like a step. As a result, hysterisis is occurred is a current-voltage characteristic.

Because a forward voltage is applied to the semiconductor device, low-voltage drive become possible and insulation separation between elements becomes easy. And because it is considered that electrons are propagated in the quantum-wave interference layers as a wave at a high speed, a response velocity becomes fast.

The thicknesses of the first layer W and the second layer B are determined for selectively reflecting the holes or the electrons, because of the difference in potential energy between the valence and the conduction bands, and the difference in effective mass of holes and electrons in the first layer W and the second layer B. In other words, the optimum thickness for reflecting electrons is not the optimum thickness for reflecting holes. Equations 3–8 refer to a structure of the quantum-wave interference layer for selectively reflecting electrons. The thickness for selectively reflecting electrons is designed based on the difference in the potential energy of the conduction band and on the effective mass of electrons. Further, the thickness for selectively reflecting holes is designed based on the difference in the potential energy of the valence band and on the effective mass of holes, forming another type of quantum-wave interference layer in an i-layer for reflecting only holes and allowing electrons to pass through.

Accordingly, a quantum-wave interference layer unit which reflects holes and functions as a reflective layer to holes can be formed to connect in series to each quantum-wave interference layer units described above, which reflects only electrons.

The semiconductor device described above having a quantum-wave interference layer unit can have a state not to occur electric current by reflecting carriers selectively in a range of 0 V to a certain value of a bias voltage. Accordingly, the semiconductor device can be formed by only one of the n-layer and the p-layer in which the quantum-wave interference layer units and the middle layer are formed. Alternatively, the semiconductor device can be formed by a pn junction structure, in which the quantum-wave interference layer units and the middle layer are formed.

The quantum-wave interference layer was formed in the i-layer, which is placed between the n-layer and the p-layer of the semiconductor device having an nip structure. Alternatively, the quantum-wave interference layer can be formed in a semiconductor device having only n-layers or p-layers. Further alternatively, a quantum-wave interference layer which reflects electrons and a quantum-wave interference layer which reflects holes can be arranged in series.

Forming the quantum-wave interference layer of electrons in the p-layer and that of holes in the n-layer enables to vary V-I characteristic of the diode more abruptly and lower its dynamic resistance notably.

Fourth Aspect of the Present Invention

FIG. 5 shows a plurality quantum-wave units $I_k$ with arbitrary periods $T_k$ including a first layer having a thickness of $D_{Wk}$ and a second layer having a thickness of $D_{Bk}$ and arranged in series.

Each thickness of the first and the second layers satisfies the formulas:

$$D_{Wk}=n_{Wk}\lambda_{Wk}/4=n_{Wk}h/4\ [2m_{Wk}(E_k+V)]^{1/2} \qquad (9)$$

and $$D_{Bk}=n_{Bk}\lambda_{Bk}/4=n_{Bk}h/4\ (2m_{Bk}E_k)^{1/2} \qquad (10)$$

In Eqs. 9 and 10, $E_k$, $m_{Wk}$, $m_{Bk}$, and $n_{Wk}$ and $n_{Bk}$ represent plural kinetic energy levels of carriers conducted into the second layer, effective mass of carriers with kinetic energy $E_k+V$ in the first layer, effective mass of carriers with kinetic energy $E_k$ in the second layer, and arbitrary odd numbers, respectively.

The plurality of the partial quantum-wave interference layers $I_k$ are arranged in series from $I_1$ to $I_j$, where j is a maximum number of k required to form a quantum-wave interference layer as a whole. The carriers existing in a certain consecutive energy range can be reflected by narrowing a discrete intervals.

Fifth and Sixth Aspects of the Present Invention

The fifth aspect of the present invention is to form the middle layer to have a band structure in which the bottom of a conduction band of the middle layer is lower than a bottom of a conduction band in the second layer B when carriers are electrons, and a band structure in which the bottom of a valence band of the middle layer is lower than a bottom of a valence band in the second layer B when carriers are holes. FIGS. 1B–E illustrate the above embodiment.

The sixth aspect of the present invention is to form the middle layer to have half a thickness of its quantum-wave wavelength $\lambda_W$. As a result, the carriers conducted in the i-layer can be confined effectively.

Seventh Aspect of the Present Invention

The seventh aspect of the present invention is to form a δ layer at the interface between the first layer W and the second layer B. The δ layer has a thickness substantially thinner than both of the first layer W and the second layer B and sharply varies the energy band profile of the device. The reflectivity R of the interface is determined by Eq. 5. By forming the δ layer, the potential energy V of an energy band becomes larger and the value x of Eq. 5 becomes smaller. Accordingly, the reflectivity R becomes larger.

Variations are shown in FIGS. 6A to 6C. The δ layer may be formed on both ends of every first layer W as shown in FIGS. 6A to 6C. In FIG. 6A, the δ layers are formed so that an energy level higher than that of the second layer B may be formed. In FIG. 6B, the δ layers are formed so that an energy level lower than that of the first layer W may be formed. In FIG. 6C, the δ layers are formed so that a band bottom higher than that of the second layer B and a band bottom lower than that of the first layer W may be formed. As an alternative to each of the variations shown in FIGS. 6A to 6C, the δ layer can be formed on one end of every first layer W.

BRIEF DESCRIPTION OF THE DRAWINGS

Other objects, features, and characteristics of the present invention will become apparent upon consideration of the following description and the appended claims with reference to the accompanying drawings, all of which form a part of the specification, and wherein reference numerals designate corresponding parts in the various figures, wherein:

DETAILED DESCRIPTION OF THE PREFERRED EMBODIMENTS

The invention will be more fully understood by reference to the following examples.

EXAMPLE 1

Figure 7:
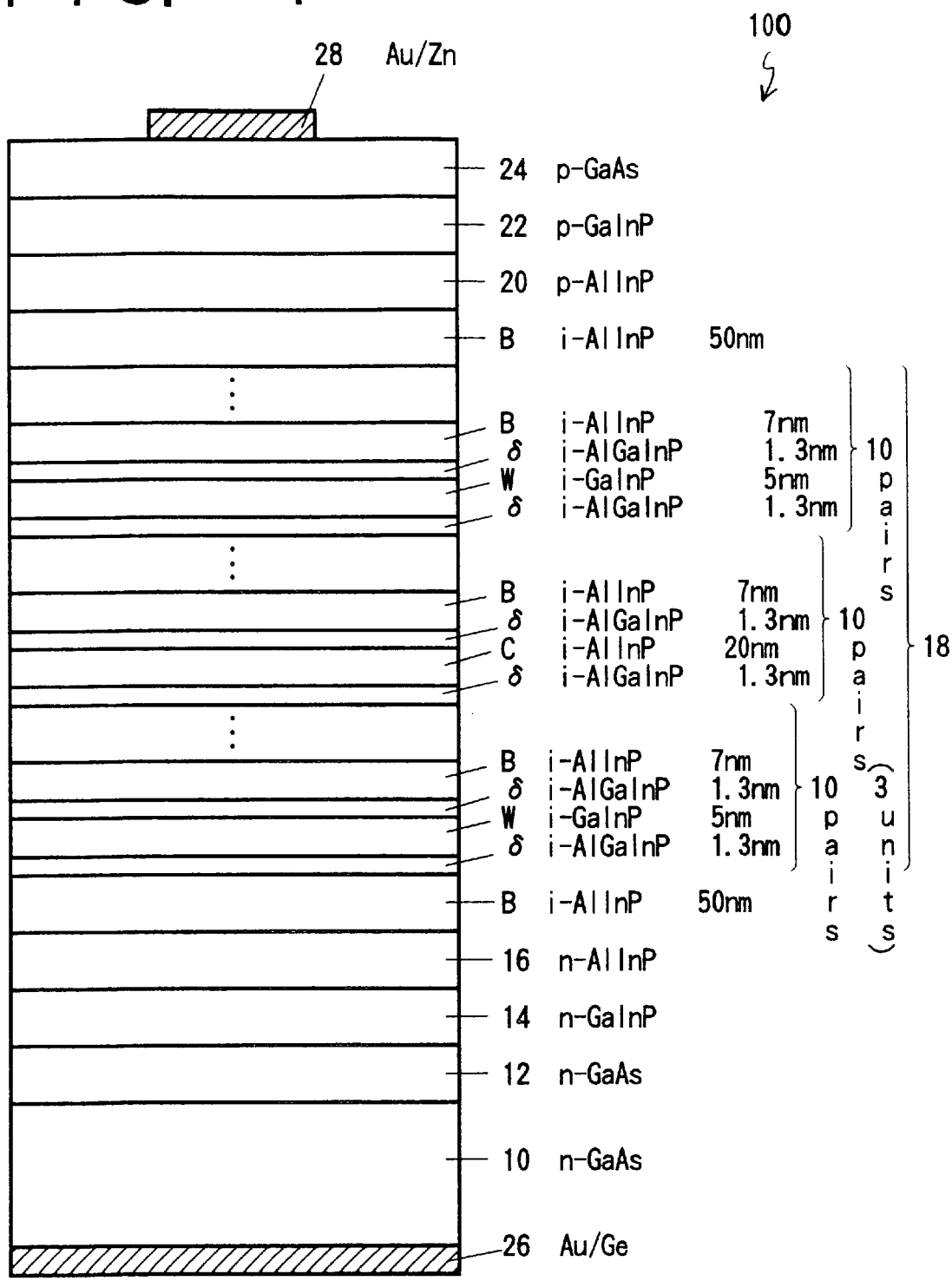
FIG. 7 is a sectional view showing a structure of a semiconductor device (diode) of the present invention.

FIG. 7 is a sectional view of a semiconductor device 100 in which a quantum-wave interference layer is formed in an i-layer. The semiconductor device 100 has a substrate 10 made of gallium arsenide (GaAs). A GaAs buffer layer 12 of n-type conduction, having a thickness generally of 0.3 μm and an electron concentration of $2 \times 10^{18}/cm^3$, is formed on the substrate 10. An n-$Ga_{0.51}In_{0.49}P$ contact layer 14 of n-type conduction, having a thickness generally of 0.13 μm and electron concentration of $2 \times 10^{18}/cm^3$, is formed on the buffer layer 12. An n-$Al_{0.51}In_{0.49}P$ n-layer 16 of n-type conduction, having a thickness generally of 0.2 μm and an electron concentration of $1 \times 10^{18}/cm^3$, is formed on the contact layer 14. A non-doped i-layer 18 is formed on the n-layer 16. A $Al_{0.51}In_{0.49}P$ p-layer 20 of p-type conduction, having a thickness generally of 0.2 μm and a hole concentration of $1 \times 10^{18}/cm^3$, is formed on the i-layer 18. A p-$Ga_{0.51}In_{0.49}P$ second contact layer 22 of p-type conduction, having a thickness generally of 0.13 μm and a hole concentration of $2 \times 10^{16}/cm^3$, is formed on the p-layer 20. An p-GaAs first contact layer 24 of p-type conduction, having a thickness generally of 0.06 μm and a hole concentration of $2 \times 10^8/cm^3$, is formed on the second contact layer 22. An electrode layer 26 made of gold and germanium (Au/Ge), having a thickness generally of 0.2 μm, is formed so as to cover the entire back of the substrate 10. Another electrode layer 28 made of gold and zinc Au/Zn, having a thickness generally of 0.2 μm, is formed on some portion of the first p-type contact layer 24.

Figure 6A:
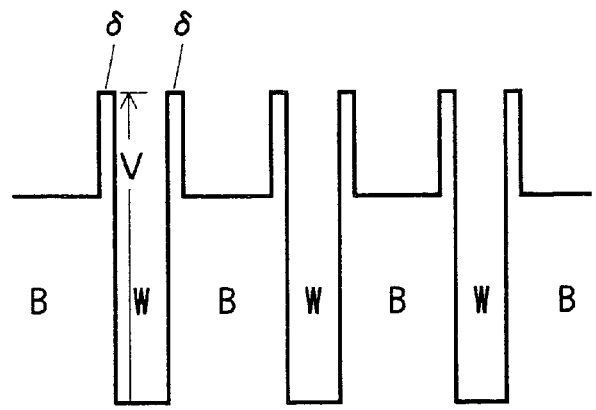
FIGS. 6A to 6C are explanatory views of δ layers according to the seventh aspect of the present invention.
Figure 6B:
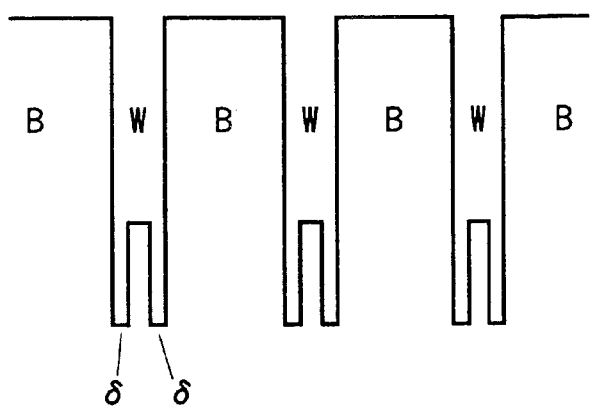
Figure 6C:
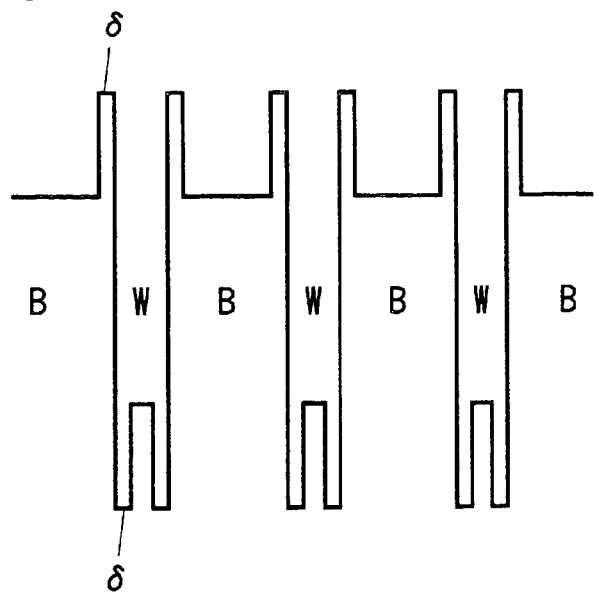

A quantum-wave interference unit $Q_1$ having a multi-quantum layer structure with 10 pairs of a $Ga_{0.51}In_{0.49}P$ first layer W, having a thickness of 5 nm, a $Al_{0.51}In_{0.49}P$ second layer B, having a thickness of 7 nm, and a non-doped $Al_{0.33}Ga_{0.33}In_{0.33}P$ δ layer, having a thickness of 1.3 nm, sandwiching the first layer W is formed in the i-layer 18. $Q_2$, ... $Q_4$ are formed like $Q_1$, and 4 quantum-wave interference units in total are formed in the i-layer 18. FIGS. 6A to 6C show band structures of the quantum-wave interference layer $Q_1$ in detail. A non-doped $Al_{0.51}In_{0.49}P$ middle layers $C_1$ to $C_3$, having a thickness of 14 nm, is formed between any quantum-wave interference units $Q_i$ and $Q_j$, respectively. Thicknesses of the first layer W and the second layer B are determined according to Eqs. 1 and 2, respectively, on condition that a forward voltage is applied between the electrodes 28 and 26, and that no electric potential gradient is occurring in the i-layer 18.

The second layers B which contact to the n-layer 16 and the p-layer 20 have thickness of 0.05 μm, respectively. They are formed thicker than other second layers to prevent a tunneling conduction of carriers from the n-layer 16 or the p-layer 20 to the first layer W. And the substrate 10 has a diameter of 2.0 inches and the normal direction of its main surface is offset toward the [011] axis by 15 degree from the (100) plane.

The semiconductor device 100 was manufactured by gas source molecular beam epitaxial deposition (GS-MBE) which is an epitaxial growth method under extremely high vacuum condition. GS-MBE is different from a conventional MBE which supplies group III and V elements both from solid state sources. In GS-MBE, group III elements such as indium (In), gallium (Ga), and aluminum (Al) are supplied from a solid source and group V elements such as arsenic (As) and phosphorus (P) are supplied by heat decomposition of gas material such as $ASH_3$ and $PH_3$. Alternatively, the semiconductor device 100 can be manufactured by metal organic chemical vapor deposition (MOCVD).

As shown in FIG. 1, as a forward voltage V applied to the interface between the p-layer 20 and the n-layer 16 of the semiconductor device 100 increases, an electric potential gradient occurring in the i-layer 18 becomes gentler until it becomes plane. In this condition, electrons do not flow because a reflection condition to electrons in quantum-wave interference layers $Q_1$ to $Q_4$ is satisfied.

Figure 1A:
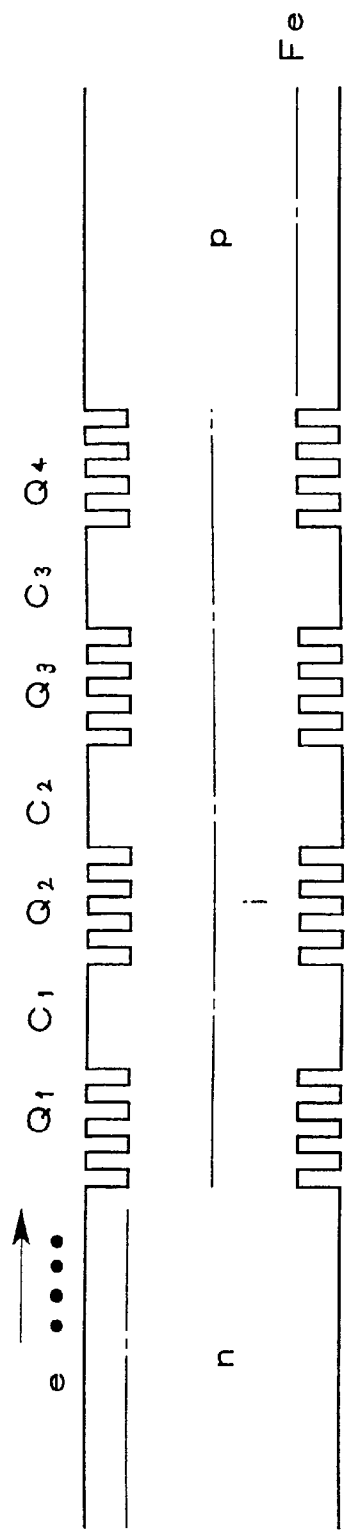
FIGS. 1A to 1E are explanatory views of a conduction band of a multi-layer structure of the present invention; ratio x and a reflectivity R.
Figure 1B:
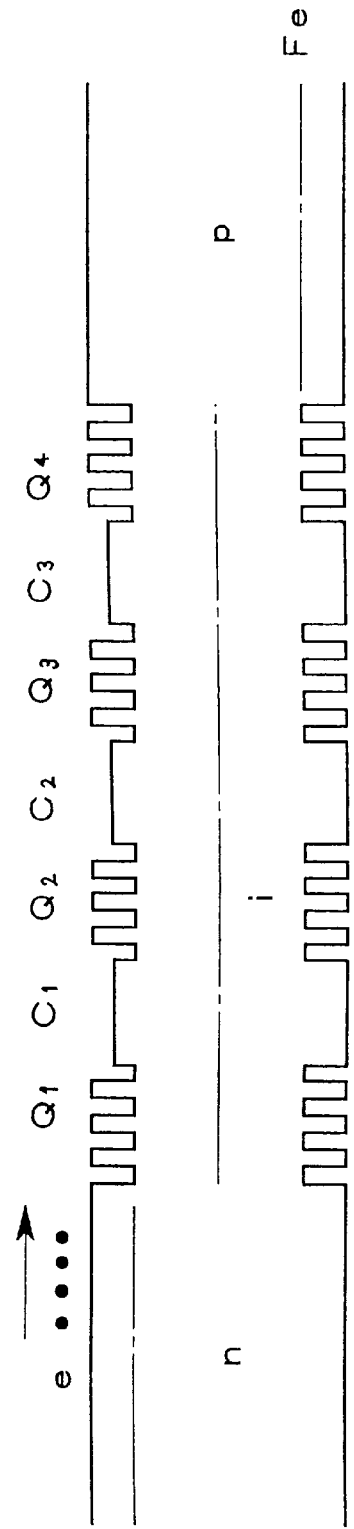
Figure 1C:
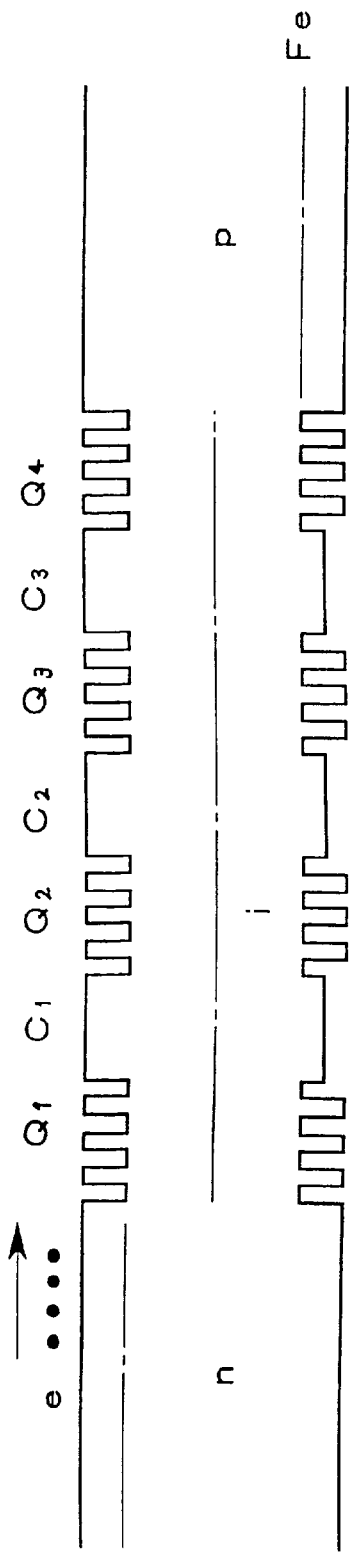
Figure 1D:
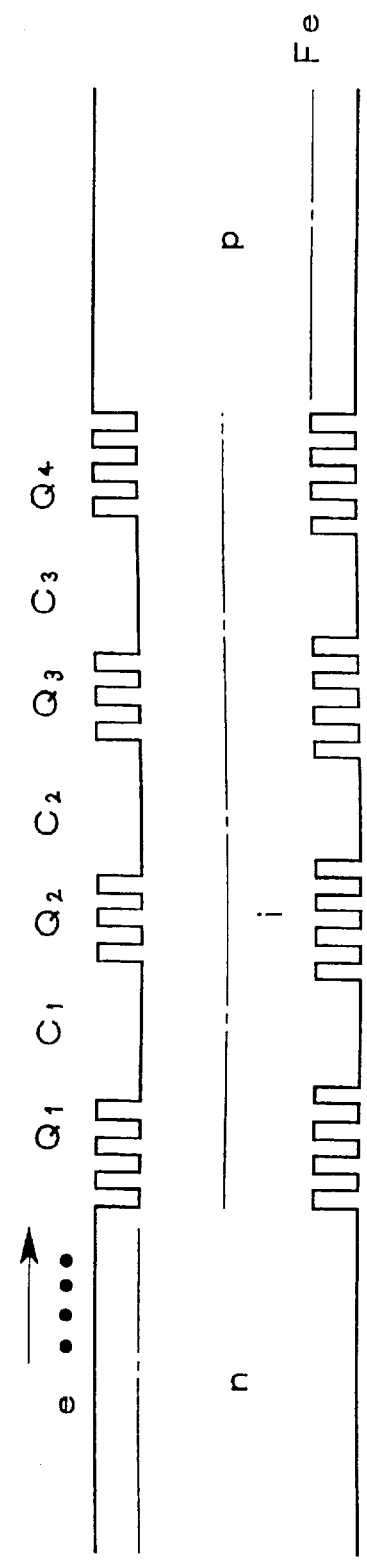
Figure 1E:
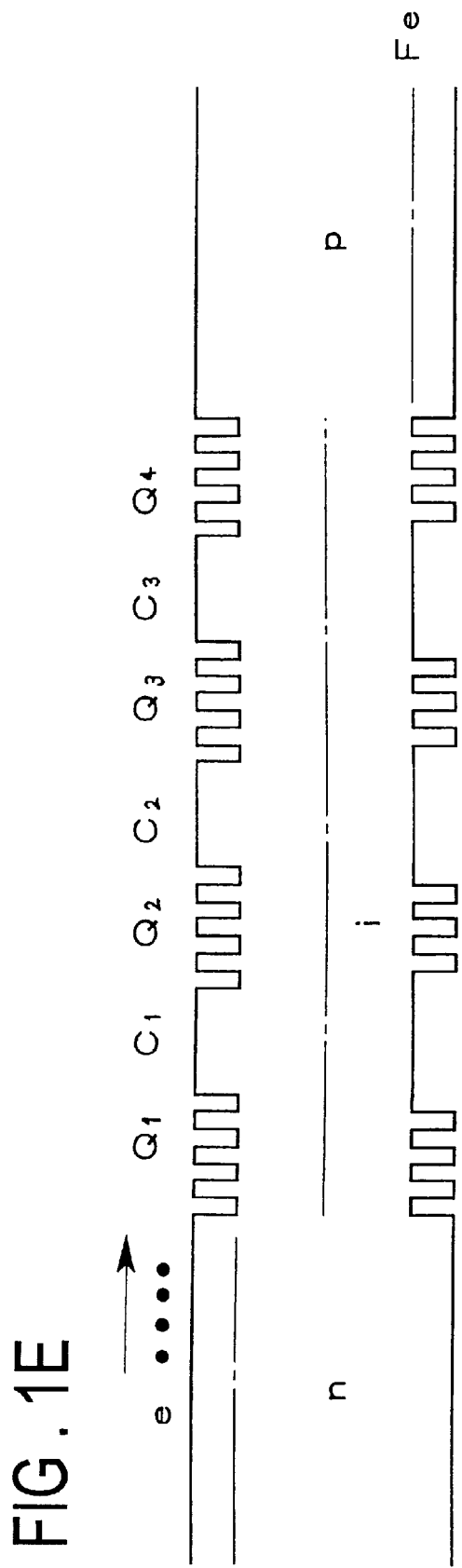
Figure 2A:
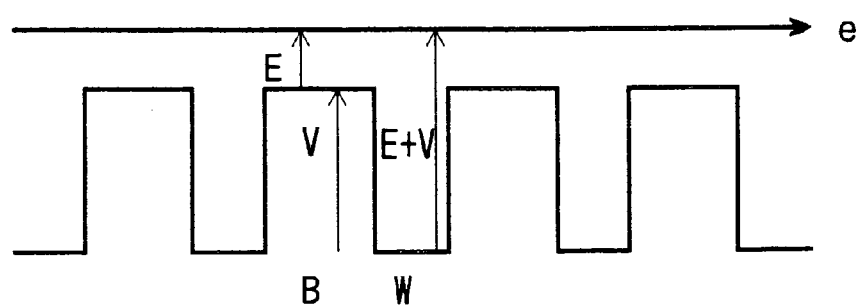
Figure 2B:
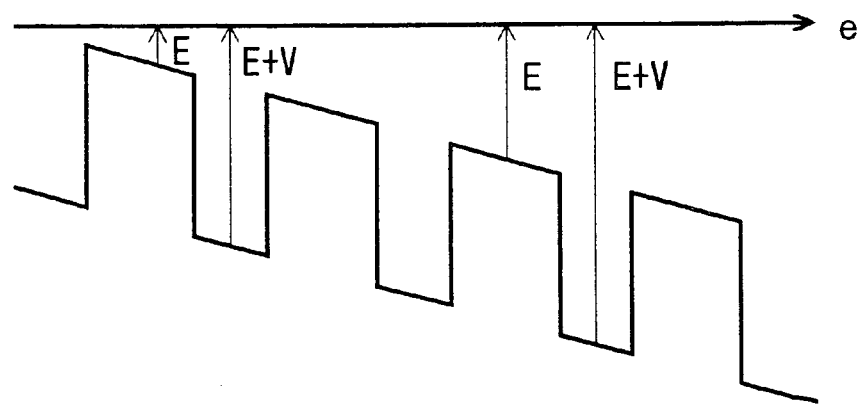
Figure 3:
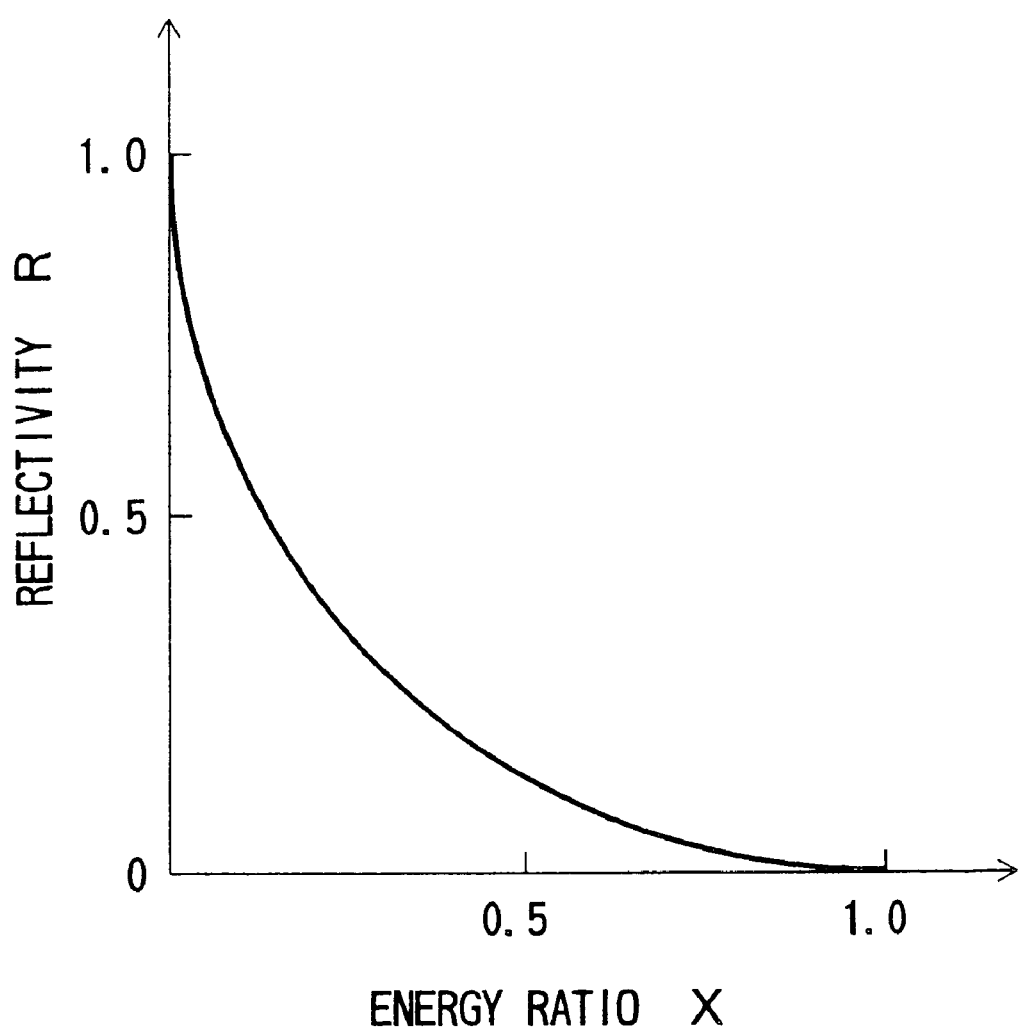
Figure 4:
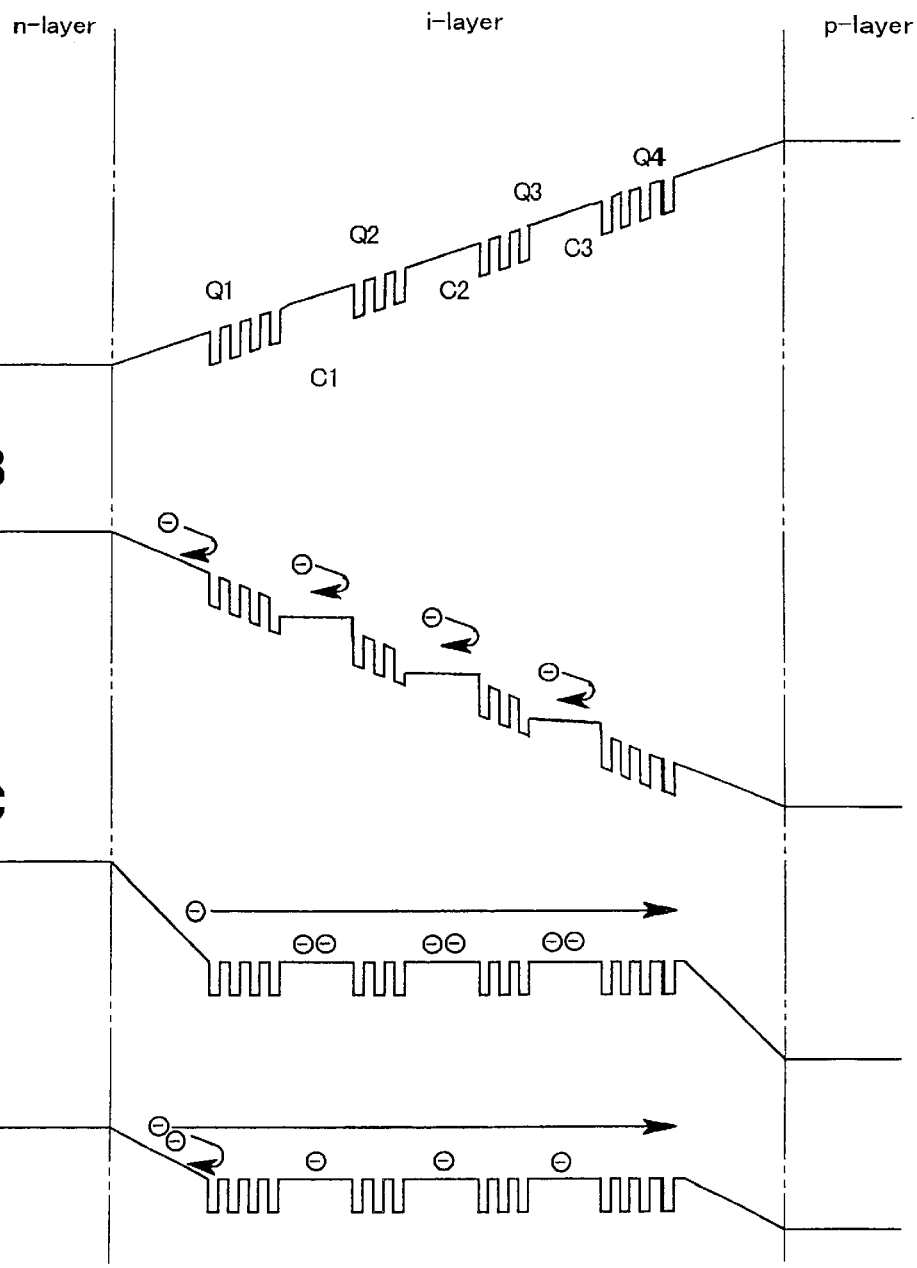
FIGS. 4A to 4D are explanatory views of conduction bands of multi-layer structure to explain that the device of the present invention has a hysterisis characteristic as a current-voltage characteristic.
Figure 5:
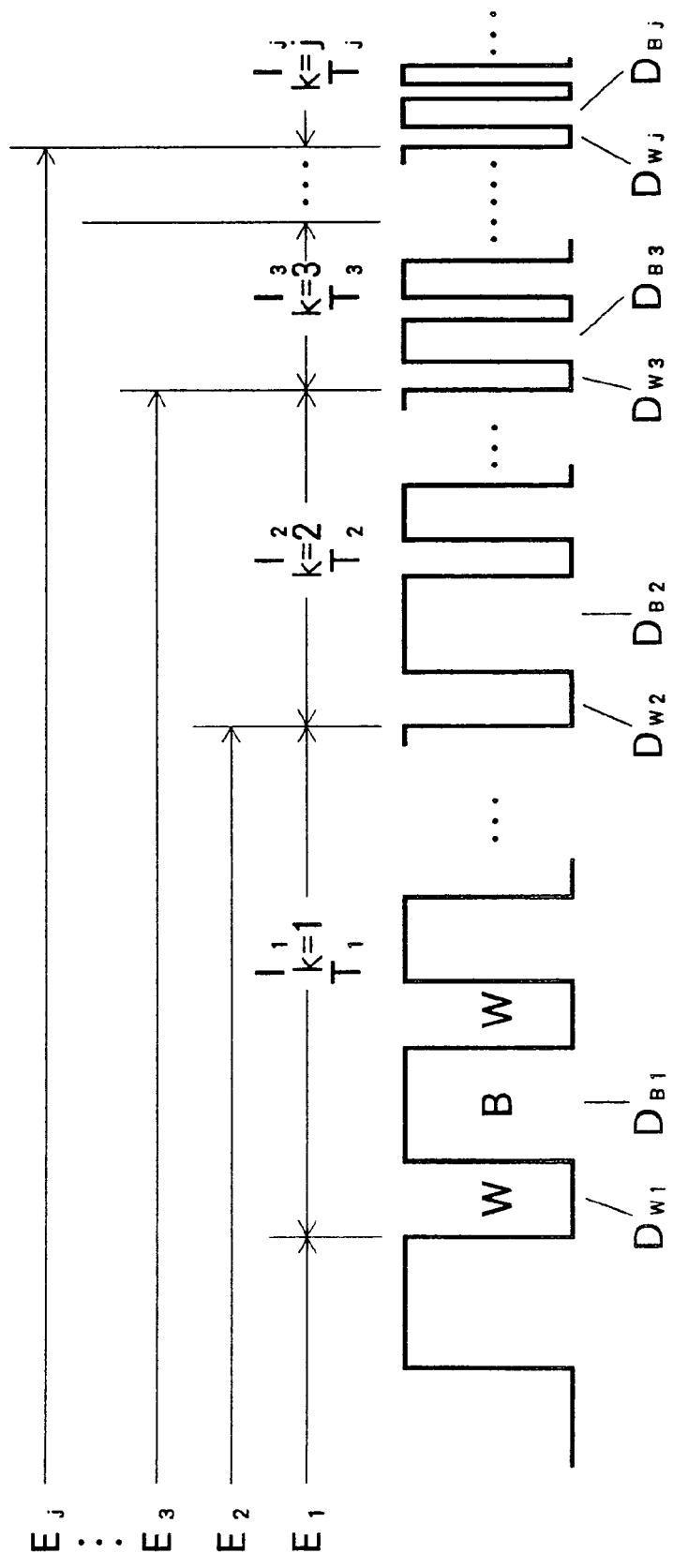
FIG. 5 is an explanatory view of the partial quantum-wave interference layers $I_k$ according to the fourth aspect of the present invention.

When the forward voltage v applied to the interface between the p-layer 20 and the n-layer 16 of the semiconductor device 100 increases moreover, a condition of the conduction band becomes as shown in FIG. 4B. In this condition, electrons flow because a reflection condition to electrons in quantum-wave interference layers $Q_1$ to $Q_4$ is not satisfied, and carriers are accumulated in the middle layers $C_1$ to $C_3$. An electron concentration in the middle layers $C_1$ to $C_3$ becomes larger, and many electrons become to exist the levels higher than the bottom of a conduction band in the second layer B. Then electrons in the n-layer 16 are conducted into the middle layers $C_1$ which is adjacent to the n-layer 16, and electrons in the middle layers $C_1$ are conducted into the middle layers $C_2$. Accordingly, electrons intervene each middle layers $C_1$ and are conducted to each middle layers at a high speed, by wave propagation of electrons as a wave. FIG. 4C shows a condition of the conduction band described above.

When electrons are not excited in the middle layers $C_1$ to $C_3$, a condition to reflect electrons is satisfied in the quantum-wave interference layers $Q_1$ to $Q_4$. But when electrons are excited in the middle layers $C_1$ to $C_3$, the condition is not satisfied and electrons may be conducted in the quantum-wave interference layers $Q_1$ to $Q_4$ as a wave. Accordingly, a switching velocity is considered to be larger.

Figure 8:
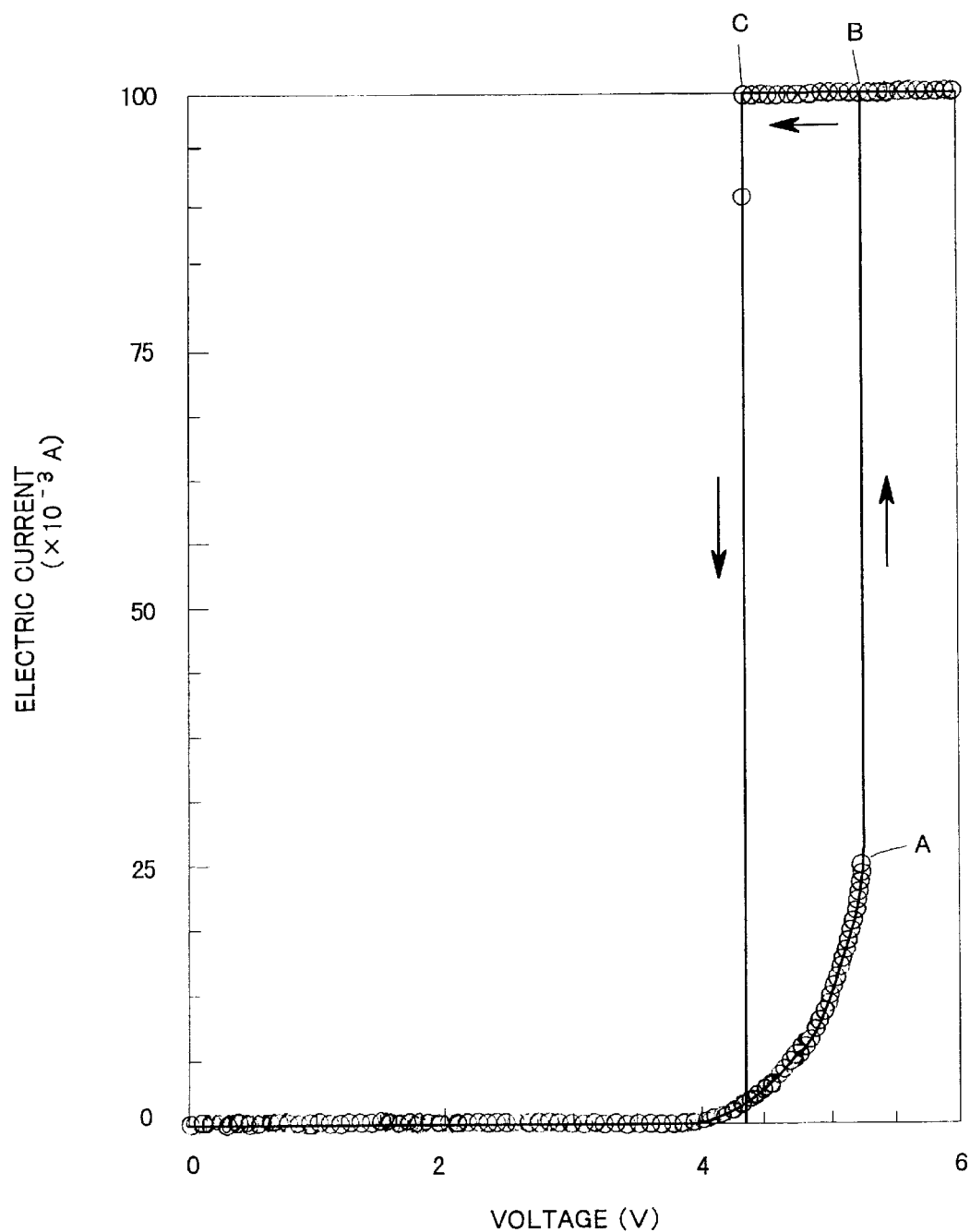
FIG. 8 is a graph showing V-I characteristic of the semiconductor device (diode) 100.

Measured V-I characteristic of the semiconductor device 100 is shown in FIG. 8. When a voltage increases, the electric current rises abruptly at the forward voltage of about 5.3 V, which is indicated by a point A. But when a voltage applied to the device decreases, an electric current decreases abruptly at the forward voltage of about 4.3 V, which is indicated by a point C.

Thus a hysterisis characteristic of about 1 V is observed as a current-voltage characteristic. Schmitt circuit which prevents chattering can be provided by using the semiconductor device independently.

In the embodiment, a δ layer is formed in the semiconductor device 100. The δ layer improves the reflectivity of the device 100. Alternatively, because the reflectivity can be improved by a multipath reflection, the δ layer is not necessarily needed.

Figure 9:
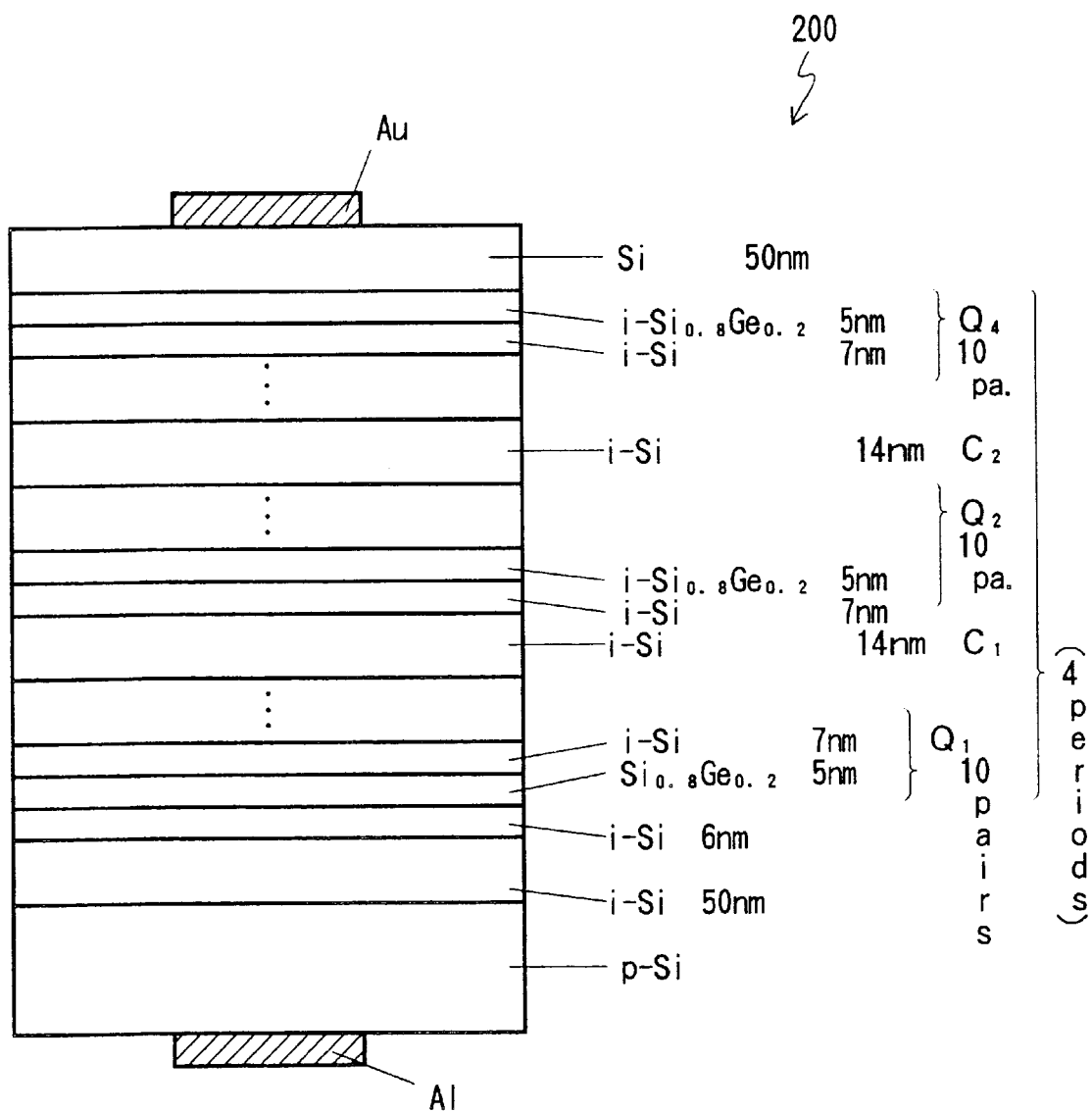
FIG. 9 is a sectional view showing a structure of a semiconductor device (diode) 200.

A diode 200 using Si/Ge compound semiconductor shown in FIG. 9 is formed. A first layer W made of $Si_{0.8}Ge_{0.2}$ and a second layer B made of Si are formed to have thicknesses of 5 nm and 7 nm, respectively. Middle layers $C_1$ to $C_3$ made of Si is formed to have a thickness of 14 nm. No δ layer is formed in the diode 200. Similarly, a hysterisis characteristic similar to the current-voltage characteristic shown in FIG. 8 is observed.

In the embodiment, four quantum-wave interference units $Q_1$ to $Q_4$ are connected in series, with a middle layer C lying between each of the quantum-wave interference units. Alternatively, an arbitrary number of the quantum-wave interference units can be connected in series.

In the embodiments, the quantum-wave interference layer was formed to have a multi-layer structure including $Ga_{0.51}In_{0.49}P$ and $Al_{0.51}In_{0.49}P$ or a multi-period structure including $Si_{0.8}Ge_{0.2}$ and Si. Alternatively, the quantum-wave interference layer can be made of quaternary compounds such as a general formula $Al_xGa_yIn_{1-x-y}P$, selecting arbitrary composition ratio within the range of $0 \leq x \leq 1$, $0 \leq y \leq 1$, and $0 \leq x+y \leq 1$. Further alternatively, the quantum-wave interference unit can be made of a pair of group III–V compound semiconductors with different composition ratios, a pair of group II–VI compound semiconductors with different composition ratios, and semiconductors of other hetero-material.

In the embodiments, a band structure of the middle layers $C_1$ to $C_3$ which accumulate carriers has a band structure whose bottom is equal to the bottom of a conduction band in the second layer B when carriers are electrons. Alternatively, a band structure of the middle layers $C_1$ to $C_3$ can have a band structure whose bottom is equal to the bottom of a conduction band in the first layer W. Further alternatively, the middle layers $C_1$ to $C_3$ can be formed to have a conduction band so that the bottom of the conduction band exists in the middle of the respective bottoms of the conduction bands in the first layer W and the second layer B.

Similarly, a band structure of the middle layers $C_1$ to $C_3$ which accumulate carriers can have a valence band whose bottom is equal to the bottom of a valence band in the second layer B or a bottom of a valence band in the first layer W when carriers are holes. Alternatively, the middle layers $C_1$ to $C_3$ can be formed to have a valence band so that the bottom of the valence band exists in the middle of the respective bottoms of the valence bands in the first layer W and the second layer B. Here, the word of bottom means the lowest energy level of the conduction band or the valence band. FIGS. 1B–E illustrate the above embodiments.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A semiconductor device comprising:

an n-layer with n-type conduction;

a p-layer with p-type conduction;

a negative electrode contacting said n-layer;

a positive electrode contacting said p-layer and applied with a positive voltge relative to said negative electrode;

quantum-wave interference layer units having plural periods of a pair of a first layer and a second layer, said second layer having a wider band gap than said first layer;

a middle layer disposed between adjacent two of said quantum-wave interference layer units; and wherein the thickness of said first layer ($D_W$) is equal to $n_W\lambda_W/4$, where $n_W$ is an odd number and $\lambda_W$ is a quantum-wave wavelength of carriers injected in the first layer;

the thickness of said second layer ($D_B$) is equal to $n_B\lambda_B/4$, where $n_B$ is an odd number and $\lambda_B$ is a quantum-wave wavelength of carriers injected in the second layer;

the carriers in said first and second layers are selected from the group consisting of electrons and holes, said middle layer does not have a multi-period structure but has a plane structure in a band structure, wherein said quantum-wave interference layer units and the middle layer are connected in series, wherein a kinetic energy of said carriers which determines said quantum-wave wavelength is set at a level near the bottom of a conduction band or a valence band of said second layer, according to the case that said carriers are electrons and holes, respectively, wherein said quantum-wave wavelength $\lambda_W$ in said first layer is equal to $h/[2m_W(E+V)]^{1/2}$, said quantum-wave wavelength $\lambda_B$ in said second layer is equal to $h/(2m_BE)^{1/2}$, where h, $m_W$, $m_B$, E, V, represent Plank's constant, an effective mass of said carrier in said first layer, an effective mass of said carrier in said second layer, a kinetic energy of carriers flowing into said second layer, a potential energy of said second layer to said first layer, respectively.

2. A semiconductor device according to claim 1, wherein said middle layer has a band structure in which the bottom of a conduction band of the middle layer is lower than a bottom of a conduction band in said second layer (B) when carriers are electrons, and a band structure in which the bottom of a valence band of the middle layer is lower than a bottom of a valence band in said second layer (B) when carriers are holes.

3. A semiconductor device according to claim 2, wherein said middle layer is formed to have half a thickness of said quantum-wave wavelength $\lambda_W$.

4. A semiconductor device according to claim 1, wherein said middle layer is formed to have half a thickness of said quantum-wave wavelength $\lambda_W$.

5. A semiconductor device according to claim 1, wherein a δ layer is formed between said first layer and said second layer, said δ layer is substantially thinner than said first layer and said second layer, and sharply varies an energy band.

6. A semiconductor device according to claim 1 further comprising:
 a pin junction structure; and
 wherein said quantum-wave interference layer units and said middle layer are formed in said i-layer.

7. A semiconductor device according to claim 2 further comprising:
 a pin junction structure; and
 wherein said quantum-wave interference layer units and said middle layer are formed in said i-layer.

8. A semiconductor device according to claim 2, further comprising a hysterisis characteristic as a current-voltage characteristic.

9. A semiconductor device according to claim 4 further comprising:
 a pin junction structure; and
 wherein said quantum-wave interference layer units and said middle layer are formed in said i-layer.

10. A semiconductor device according to claim 4, further comprising a hysterisis characteristic as a current-voltage characteristic.

11. A semiconductor device according to claim 1, further comprising a hysterisis characteristic in a current-voltage characteristic.

* * * * *